US011022627B2

(12) United States Patent  
Nasu (10) Patent No.: US 11,022,627 B2  
(45) Date of Patent: Jun. 1, 2021

(54) PROBE AND ELECTRIC CONNECTING APPARATUS

(71) Applicant: Kabushiki Kaisha Nihon Micronics, Tokyo (JP)

(72) Inventor: Mika Nasu, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/484,443

(22) PCT Filed: Jan. 17, 2018

(86) PCT No.: PCT/JP2018/001240  
§ 371 (c)(1),  
(2) Date: Aug. 7, 2019

(87) PCT Pub. No.: WO2018/147024  
PCT Pub. Date: Aug. 16, 2018

(65) Prior Publication Data  
US 2020/0025797 A1 Jan. 23, 2020

(30) Foreign Application Priority Data  
Feb. 10, 2017 (JP) .............................. JP2017-022792

(51) Int. Cl.  
*G01R 1/067* (2006.01)  
*G01R 1/073* (2006.01)  
(Continued)

(52) U.S. Cl.  
CPC ..... *G01R 1/06722* (2013.01); *G01R 1/07314* (2013.01); *G01R 31/26* (2013.01); *H01R 13/2492* (2013.01); *H01R 2201/20* (2013.01)

(58) Field of Classification Search  
CPC .................. G01R 1/06722; G01R 1/07314  
See application file for complete search history.

(56) References Cited

U.S. PATENT DOCUMENTS 4,289,367 A * 9/1981 Everett .............. G01R 1/07328  
439/246  
5,641,315 A 6/1997 Swart et al.  
(Continued)

FOREIGN PATENT DOCUMENTS

CN 202720286 U 2/2013  
CN 104466484 A 3/2015  
(Continued)

*Primary Examiner* — Paresh Patel  
(74) *Attorney, Agent, or Firm* — Lorenz & Kopf, LLP (57) ABSTRACT

A probe 20 electrically connecting a first contact target to a second contact target includes a tubular barrel portion 50, a first plunger portion 60 partially inserted into a first end of the barrel portion 50 and electrically contacting the first contact target, and a second plunger portion 70 partially inserted into a second end of the barrel portion 50 and electrically contacting the second contact target. The barrel portion 50 includes a first barrel portion 51 having an inside diameter $\phi 1i$, and a second barrel portion 52 arranged inside the first barrel portion 51 and having an outside diameter $\phi 2o$. The first barrel portion 51 includes a first spring portion 151. The second barrel portion 52 includes a second spring portion 152. The first plunger portion 60 includes a main body portion 61 having a longer dimension than an inside diameter of the first barrel portion 51.

13 Claims, 6 Drawing Sheets

(51) Int. Cl.
   *G01R 31/36* (2020.01)
   *H01R 13/24* (2006.01)
   *G01R 31/26* (2020.01)

(56) References Cited

U.S. PATENT DOCUMENTS

| | | | | |
|---|---|---|---|---|
| 5,982,187 | A * | 11/1999 | Tarzwell | G01R 1/06722 |
| | | | | 324/72.5 |
| 6,696,850 | B1 * | 2/2004 | Sanders | G01R 1/06711 |
| | | | | 324/755.05 |
| 7,057,403 | B2 * | 6/2006 | Kazama | G01R 1/06722 |
| | | | | 324/755.05 |
| 9,018,967 | B2 * | 4/2015 | Hsiao | G01R 1/06722 |
| | | | | 324/755.01 |
| 2010/0007365 | A1 | 1/2010 | Ishizuka et al. | |
| 2016/0118738 | A1 * | 4/2016 | Nasu | G01R 1/06722 |
| | | | | 439/700 |
| 2018/0299489 | A1 * | 10/2018 | Yoshioka | G01R 1/07371 |
| 2020/0025800 | A1 * | 1/2020 | Shuto | G01R 31/2863 |

FOREIGN PATENT DOCUMENTS

| | | | |
|---|---|---|---|
| CN | 105552617 | A | 5/2016 |
| JP | 54-93766 | U | 7/1979 |
| JP | 3-33375 | U | 4/1991 |
| JP | 2000241447 | A | 9/2000 |
| JP | 2005106718 | A | 4/2005 |
| JP | 2009109438 | A | 5/2009 |
| JP | 2010019797 | A | 1/2010 |
| JP | 2010204082 | A | 9/2010 |
| JP | 2013050436 | A | 3/2013 |
| JP | 2016080657 | A | 5/2016 |
| JP | 2016099337 | A | 5/2016 |
| TW | 201217790 | A | 5/2012 |

* cited by examiner

PROBE AND ELECTRIC CONNECTING APPARATUS

TECHNICAL FIELD

The present invention relates to a probe and an electric connecting apparatus for use in an electric test or the like of a device under test.

BACKGROUND ART

In general, multiple integrated circuits formed on a semiconductor wafer undergo an electric test before being cut and separated from the wafer to determine whether or not they have performance corresponding to the specification. As an apparatus for use in such an electric test, an electric connecting apparatus including a plurality of probes exists.

At the time of conducting the electric test with use of the electric connecting apparatus of this kind, base end portions (upper end portions) of the plurality of probes are brought into contact with electrodes of a probe substrate connected to an apparatus such as a tester, and tip end portions (lower end portions) of the probes are brought into contact with electrodes of a device under test such as an integrated circuit.

At this time, the base end portions (upper end portions) of the probes extending upward from the electric connecting apparatus are held in a pressure-attached state of being pressure-attached to the probe substrate with predetermined load (a so-called preload state) to cause electric connection between the probes and the probe substrate to be maintained.

Also, the tip end portions of the probes extending downward from the electric connecting apparatus are in a pressure-attached state of being pressure-attached to the device under test with predetermined load (a so-called overdrive state) to cause electric connection between the probes and the device under test to be maintained. In this manner, the device under test and the probe substrate are electrically connected via the probes, and the electric test is conducted.

Also, as the probe incorporated into the electric connecting apparatus, one including a spring portion exerting a spring function (elastic force) at a part of the probe in an up-down direction is proposed (for example, refer to Patent Literature 1).

The probe includes a plunger contacting the device under test and a barrel formed in a cylindrical shape, and the barrel includes the spring portion in the up-down direction (longitudinal direction).

In this manner, the probe includes the spring portion to enable the probe to be compressed in the up-down direction and to apply an appropriate pressing force to the probe substrate and the device under test in a case in which the probe is in the preload state or in the overdrive state. Further, a variation in probe length along with a production error can be absorbed by the compression of the spring portion.

CITATION LIST

Patent Literature

PTL1: Japanese National Patent Application Public Disclosure No. 2016-99337

SUMMARY OF THE INVENTION

Problems to be Solved by the Invention

Meanwhile, in the probe according to the conventional art, the spring portion is required to have a compression length sufficient to compress the spring portion in the preload state and in the overload state and a compression length sufficient to absorb the variation in probe length along with the production error. For this reason, in the probe according to the conventional art, the spring portion is formed at a long part of the probe in the up-down direction by arranging the plurality of spring portions in series in the up-down direction, for example.

However, in a case in which the spring portion is formed at the long part in the up-down direction, the length of the probe in the up-down direction is also required to be long, which causes the probe to flex easily. In a case in which each of the probes flexes easily, the probe may contact the adjacent probe and be shorted at the time of conducting an electric test.

The present invention is accomplished in consideration of the respect, and an object of the present invention is to provide a probe and an electric connecting apparatus enabling contact between probes caused by flexure of the probes to be prevented.

Solutions to the Problems

To achieve the above object, as a first aspect of a probe according to the present invention, the probe electrically connecting a first contact target to a second contact target includes a barrel portion extending in an up-down direction and formed in a tubular shape, a first plunger portion partially inserted into a first end of the barrel portion and electrically contacting the first contact target, and a second plunger portion partially inserted into a second end of the barrel portion and electrically contacting the second contact target. The barrel portion includes a first barrel portion having a predetermined inside diameter, and a second barrel portion arranged inside the first barrel portion and having a shorter outside diameter than the predetermined inside diameter. The first barrel portion includes a first spring portion exerting a spring function in the up-down direction. The second barrel portion includes a second spring portion exerting a spring function in the up-down direction. The first plunger portion includes a main body portion having a longer dimension than an inside diameter of the first barrel portion.

As a second aspect of the probe according to the present invention, in the above aspect, the first spring portion and the second spring portion press the first plunger portion toward the first contact target.

As a third aspect of the probe according to the present invention, in the above aspect, a length of the first barrel portion in the up-down direction is shorter than a length of the second barrel portion in the up-down direction.

As a fourth aspect of the probe according to the present invention, in the above aspect, the first spring portion includes an upper first spring portion and a lower first spring portion arranged further downward in the up-down direction than the upper first spring portion.

As a fifth aspect of the probe according to the present invention, in the above aspect, the upper first spring portion and the lower first spring portion are formed in spiral shapes in opposite winding directions from each other.

As a sixth aspect of the probe according to the present invention, in the above aspect, the first barrel portion and the second barrel portion can be separated from each other.

As a seventh aspect of the probe according to the present invention, in the above aspect, the first barrel portion includes an outside first barrel portion having a separate inside diameter, and an inside first barrel portion arranged inside the outside first barrel portion and having an outside diameter which is shorter than the separate inside diameter, the outside first barrel portion includes an outside first spring portion exerting a spring function in the up-down direction, and the inside first barrel portion includes an inside first spring portion exerting a spring function in the up-down direction.

As an eighth aspect of the probe according to the present invention, in the above aspect, an upper end portion of the second plunger portion to be inserted into the barrel portion is located further upward in the up-down direction than a lower end portion of the second spring portion included in the second barrel portion.

As an aspect of an electric connecting apparatus according to the present invention, the electric connecting apparatus includes a plurality of probes electrically connecting a first contact target to a second contact target. Each of the plurality of probes includes a barrel portion extending in an up-down direction and formed in a tubular shape, a first plunger portion partially inserted into a first end of the barrel portion and electrically contacting the first contact target, and a second plunger portion partially inserted into a second end of the barrel portion and electrically contacting the second contact target. The barrel portion includes a first barrel portion having a predetermined inside diameter, and a second barrel portion arranged inside the first barrel portion and having a shorter outside diameter than the predetermined inside diameter. The first barrel portion includes a first spring portion exerting a spring function in the up-down direction. The second barrel portion includes a second spring portion exerting a spring function in the up-down direction. The first plunger portion includes a main body portion having a longer dimension than an inside diameter of the first barrel portion.

Effect of the Invention

According to the present invention, it is possible to provide a probe and an electric connecting apparatus enabling contact between probes caused by flexure of the probes to be prevented.

EMBODIMENTS OF THE INVENTION

Hereinbelow, an electric connecting apparatus according to embodiments of the present invention will be described in detail with reference to the drawings. Each of the embodiments described below illustrates an apparatus or the like to embody a technical idea of the present invention, and the technical idea of the present invention shall not specify arrangement or the like of respective components into one described below. The technical idea of the present invention can be altered in various ways within the scope of the patent claims.

First Embodiment

Configuration of Testing Apparatus

Figure 1:
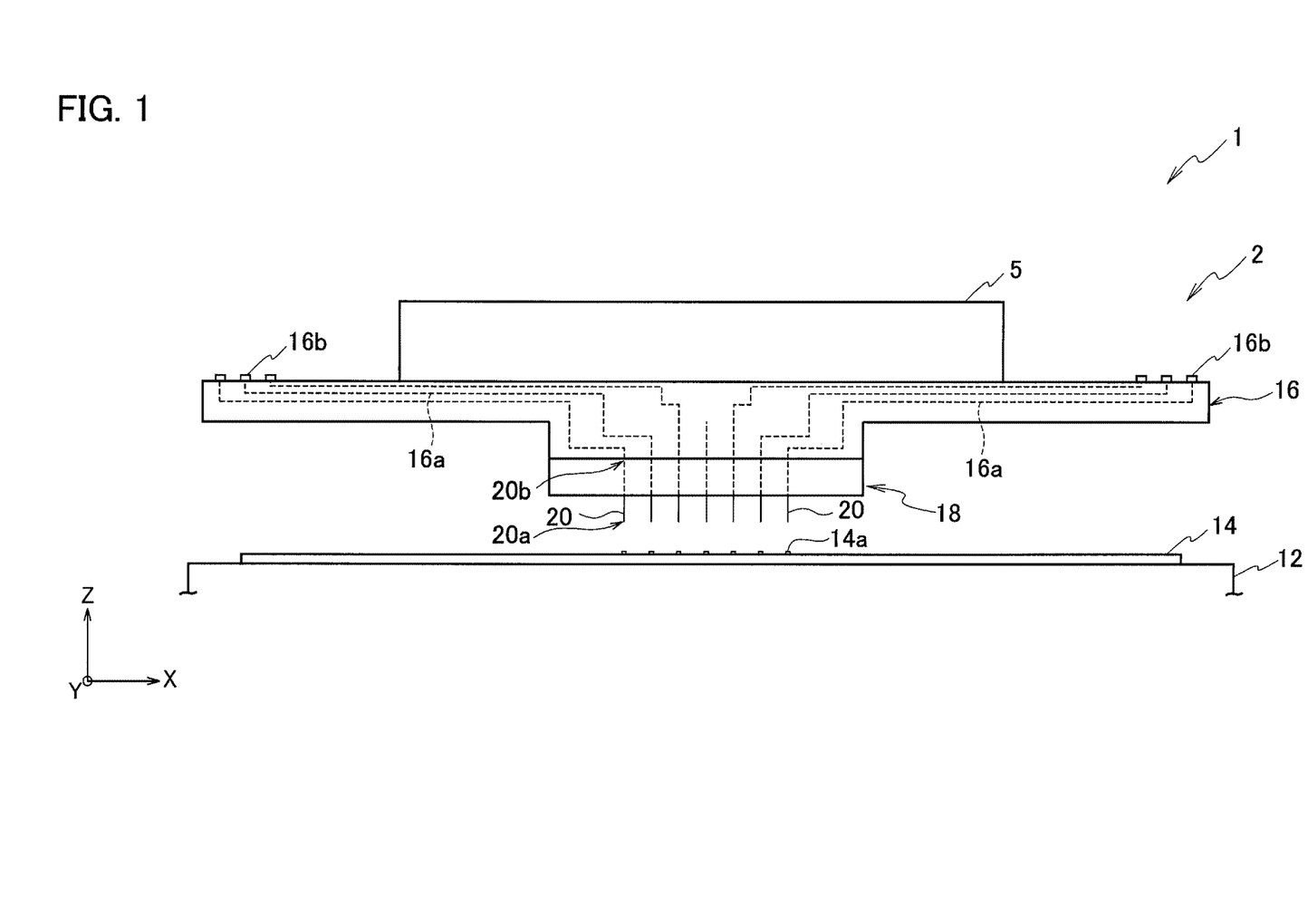
FIG. 1 is a side view schematically illustrating a testing apparatus including an electric connecting apparatus according to a first embodiment of the present invention.

FIG. 1 is a side view schematically illustrating a testing apparatus 1 including an electric connecting apparatus including a probe 20 according to a first embodiment of the present invention. Note that, for description, in the figures, an up-down direction Z, a right-left direction X perpendicular to the up-down direction Z, and a front-rear direction Y perpendicular to the up-down direction Z and the right-left direction X are defined. The up-down direction Z can also be referred to as a longitudinal direction of the probe 20.

As illustrated in FIG. 1, the testing apparatus 1 mainly includes a card-like connecting apparatus 2 and a chuck 12.

The card-like connecting apparatus 2 (referred to as a probe card in some cases) is held to a frame (not illustrated) over the chuck 12, which can move up and down. On the chuck 12, a semiconductor wafer 14 is held as an example of a device under test. The semiconductor wafer 14 has incorporated therein multiple integrated circuits.

The semiconductor wafer 14 is arranged on the chuck 12 with multiple electrode pads 14a of the integrated circuits facing upward for an electrical test of the integrated circuits.

The card-like connecting apparatus 2 includes a probe substrate 16 and a probe support body 18.

The probe substrate 16 is a circular rigid wiring substrate, for example. The probe substrate 16 is electrically connected to a base end portion 20b (upper end portion) of the probe 20.

At a circumferential portion of a first surface (an upper surface illustrated in FIG. 1) of the probe substrate 16, multiple tester lands 16b serving as connection ends to a tester (not illustrated) are provided. The tester lands 16b are connected to interconnect lines 16a provided in the probe substrate 16.

Also, on the first surface (the upper surface illustrated in FIG. 1) of the probe substrate 16, a reinforcing plate 5 made of, e.g., metal reinforcing the probe substrate 16 is provided. The reinforcing plate 5 is arranged at a center portion of the probe substrate 16 except the circumferential portion provided with the tester lands 16b. On a second surface (a lower surface illustrated in FIG. 1) of the probe substrate 16, the probe support body 18 is arranged.

The probe support body 18 is held to the probe substrate 16 by means of a predetermined holding member. The probe support body 18 includes the plurality of probes 20. The probe support body 18 prevents interference between the probes 20 when tip end portions 20a (lower end portions) of the probes 20 are pressed by the semiconductor wafer 14. Note that the probe support body 18 including the probe 20 constitutes an electric connecting apparatus described in the patent claims.

Each of the probes 20 includes the tip end portion 20a and the base end portion 20b. The tip end portion 20a of the probe 20 is arranged to be opposed to the corresponding electrode pad 14a provided on the semiconductor wafer 14.

The base end portion 20b of the probe 20 abuts on a connection pad (not illustrated) of the probe substrate 16 in a pressure-attached state of being pressure-attached to the connection pad of the probe substrate 16, that is, a preload state. In this manner, the base end portion 20b of the probe 20 is electrically connected to the probe substrate 16.

Note that, in the present embodiment, the connection pad (not illustrated) of the probe substrate 16 constitutes a first contact target described in the patent claims, and the electrode pad 14a of the semiconductor wafer 14 constitutes a second contact target described in the patent claims.

Configuration of Probe Support Body

Figure 2:
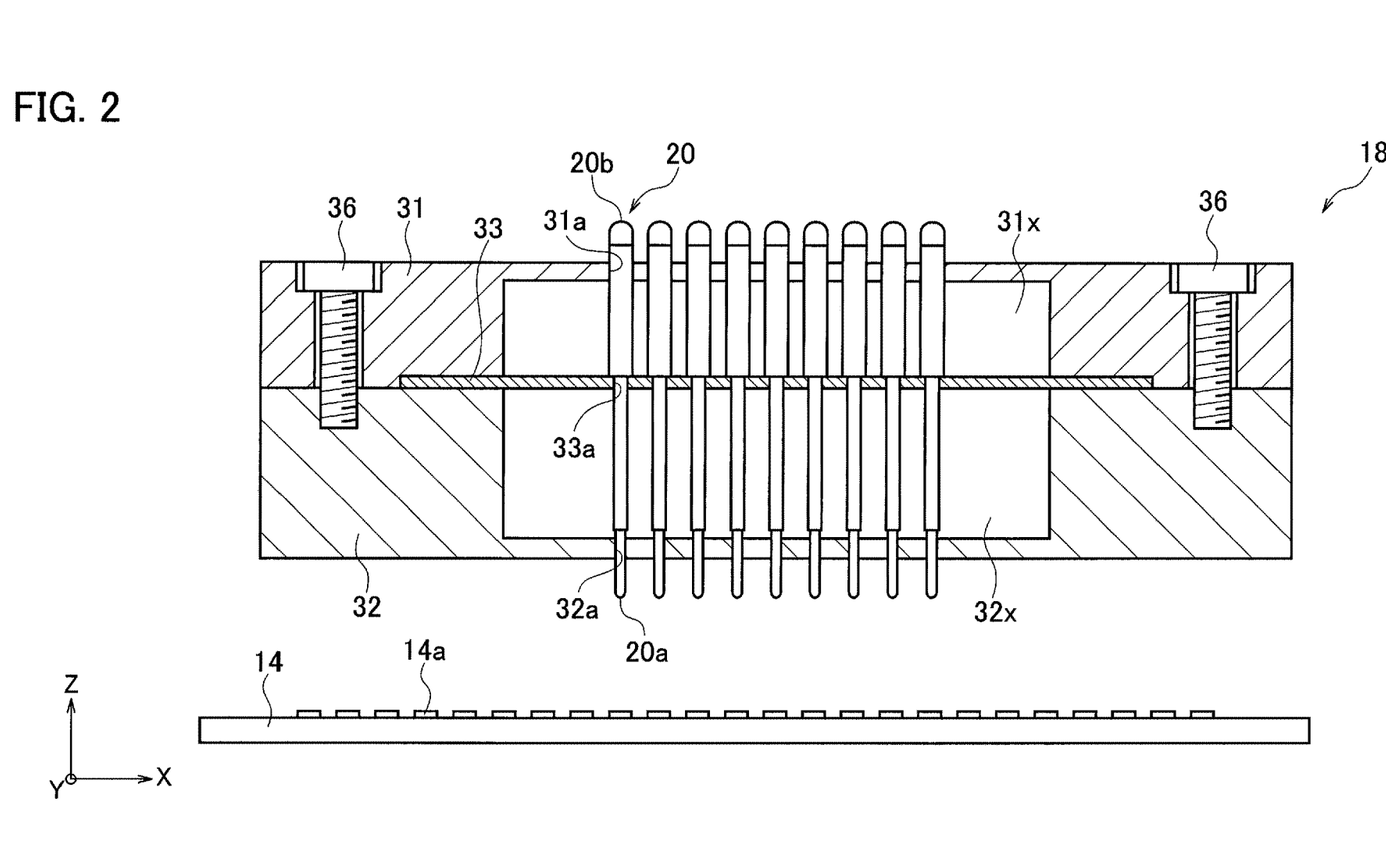
FIG. 2 is a cross-sectional view schematically illustrating the electric connecting apparatus (probe support body) according to the first embodiment of the present invention.

Next, referring to FIG. 2, a configuration of the probe support body 18 will be described in detail. FIG. 2 is a cross-sectional view describing a schematic configuration of the probe support body 18. Here, FIG. 2 illustrates nine probes 20 for simplification of the description, and the number of probes is not limited to nine. Also, although FIG. 2 illustrates a case in which the plurality of probes 20 are arranged in one row, the arrangement of the probes 20 is not limited to this, and the probes 20 may be arranged arbitrarily such as in a matrix form as seen in the up-down direction Z. Note that FIG. 2 illustrates a schematic configuration of the probe 20, and a detailed configuration of the probe 20 will be described below (refer to FIG. 3).

The probe support body 18 includes an upper guide plate 31, a lower guide plate 32, an intermediate guide plate 33, a securing screw 36, and the probe 20.

The upper guide plate 31 is a support member for positioning and holding an upper portion of each of the probes 20 and allowing the probe 20 to slide. In other words, the upper guide plate 31 is a position holding guide for the upper portion of each of the probes 20. The upper guide plate 31 is formed in a flat plate shape including at a center thereof a recess 31x recessed upward. The recess 31x is provided with a guide hole 31a through which the upper portion of the probe 20 passes and which supports the upper portion of the probe 20. The diameter of the guide hole 31a is longer than the diameter of a guide hole 32a of the lower guide plate 32 and is longer than the diameter of a guide hole 33a of the intermediate guide plate 33.

The guide holes 31a are arranged to align with the respective guide holes 33a of the intermediate guide plate 33 and are provided to correspond to positions aligning with not-illustrated respective electrodes of the probe substrate 16. Consequently, the upper portion of each probe 20 is fitted into each guide hole 31a to cause the base end portion 20b of each probe 20 to contact each connection pad of the probe substrate 16. Due to a below-mentioned spring function of each probe 20, the upper portion of each probe 20 slides in a state of passing through each guide hole 31a along with expansion and contraction of the probe 20.

Meanwhile, the upper guide plate 31 is made of ceramic, for example, and is insulated. Also, the upper guide plate 31 may be replaced with a spacer formed in a hollowed circular shape, a hollowed rectangular shape, or the like.

The lower guide plate 32 is a support member for positioning and holding a lower portion of each of the probes 20 and allowing the probe 20 to slide. In other words, the lower guide plate 32 is a position holding guide for the lower portion of each of the probes 20. The lower guide plate 32 is formed in a flat plate shape including at a center thereof a recess 32x recessed downward. The recess 32x is provided with the guide hole 32a through which the lower portion of the probe 20 passes and which supports the lower portion of the probe 20. The diameter of the guide hole 32a is shorter than the diameter of the guide hole 31a of the upper guide plate 31 and is shorter than the diameter of the guide hole 33a of the intermediate guide plate 33.

The guide holes 32a are provided at positions aligning with the respective electrode pads 14a of the semiconductor wafer 14 to correspond to the respective electrode pads 14a. Consequently, the lower portion of each probe 20 is fitted into each guide hole 32a to cause the tip end portion 20a of each probe 20 to contact each electrode pad 14a of the semiconductor wafer 14. Due to the below-mentioned spring function of each probe 20, the lower portion of each probe 20 slides in a state of passing through each guide hole 32a along with expansion and contraction of the probe 20.

Meanwhile, the lower guide plate 32 is made of ceramic, for example, and is insulated. Also, the lower guide plate 32 may be replaced with a spacer formed in a hollowed circular shape, a hollowed rectangular shape, or the like.

The intermediate guide plate 33 is a member for preventing short between the adjacent probes 20 and keeping verticality of each of the probes 20. The intermediate guide plate 33 is interposed and supported at a circumference thereof between the upper guide plate 31 and the lower guide plate 32.

The intermediate guide plate 33 is provided with the corresponding guide holes 33a at positions aligning with the respective guide holes 31a of the upper guide plate 31 and the respective guide holes 32a of the lower guide plate 32. The diameter of the guide hole 33a of the intermediate plate 33 is shorter than the diameter of the guide hole 31a of the upper guide plate 31 and is longer than the diameter of the guide hole 32a of the lower guide plate 32.

Meanwhile, the intermediate guide plate 33 is a thin plate made of a synthetic resin film excellent in abrasion resistance and heat resistance such as a polyimide film. The intermediate guide plate 33 may be made of ceramic or the like.

The securing screw 36 is a screw for integrally securing the entire probe support body 18. The upper guide plate 31, the lower guide plate 32, and the intermediate plate 33 are removably integrally secured by the securing screw 36.

Configuration of Probe

Figure 3:
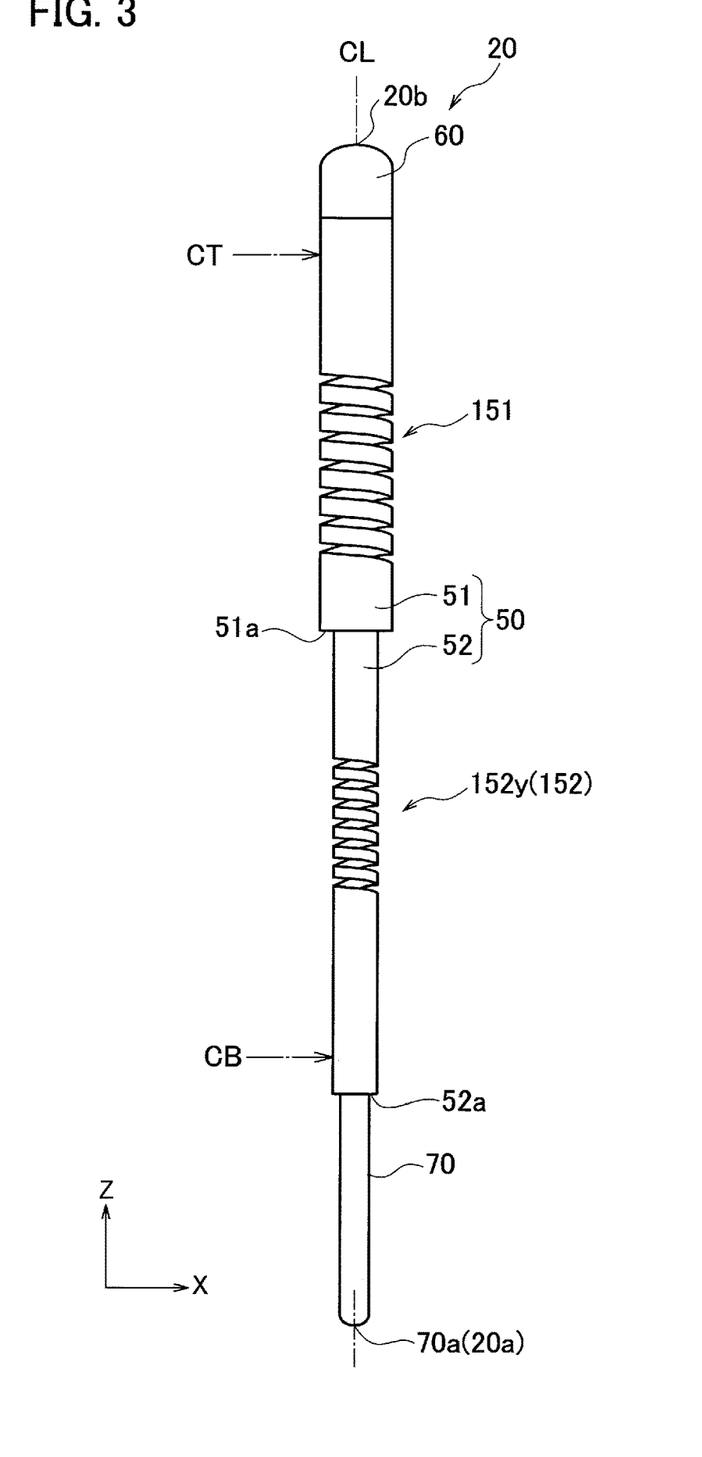
FIG. 3 is a side view schematically illustrating a probe according to the first embodiment of the present invention.

Next, referring to FIGS. 3 to 5, a configuration of the probe 20 according to the first embodiment will be described in detail. FIG. 3 is a side view of the probe 20, FIG. 4 is a cross-sectional view of the probe 20 along a center axis of the probe 20 attached to the probe support body 18, and FIG. 5 is a cross-sectional view illustrating a state in which the probe 20 is attached to the probe support body 18.

Figure 4:
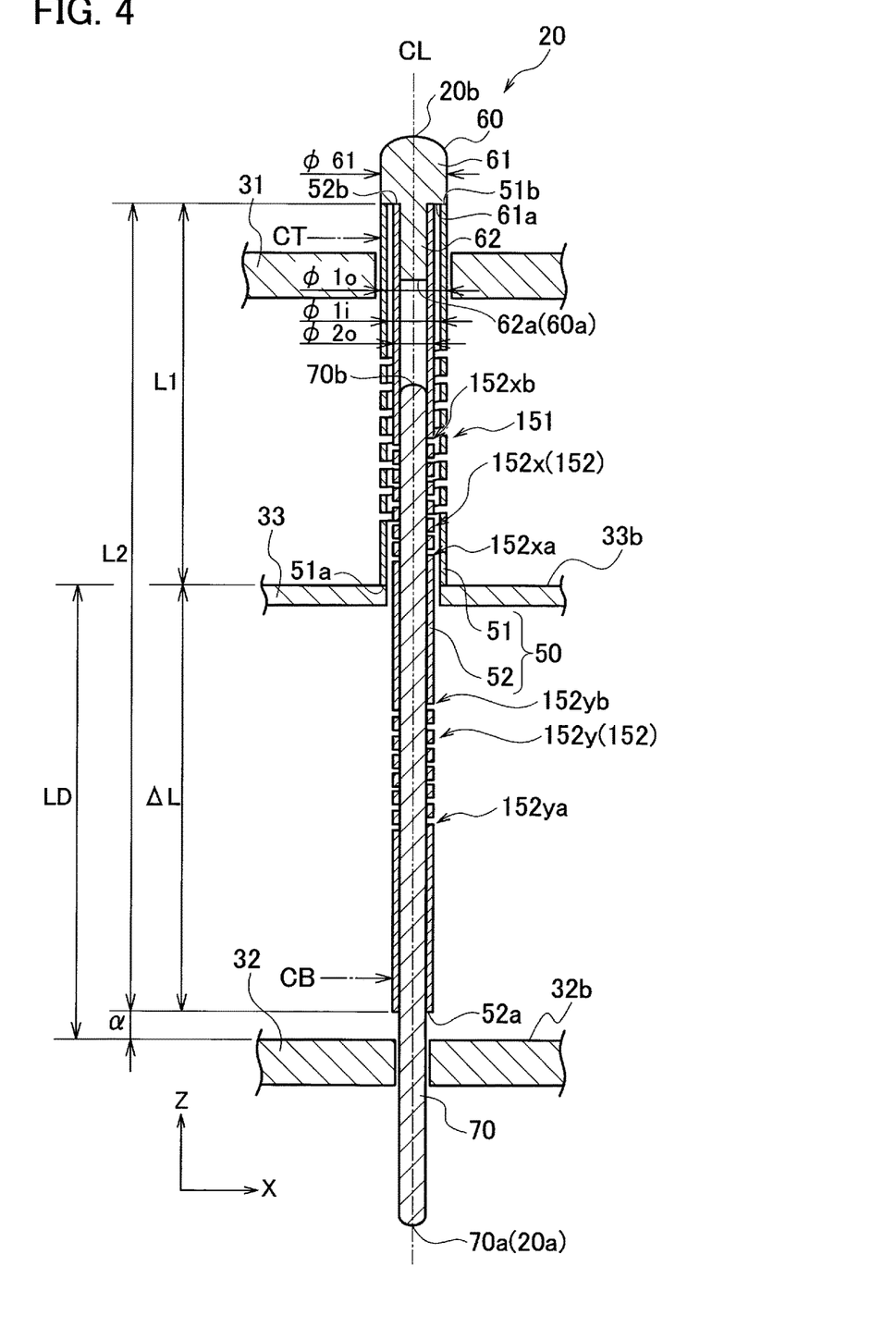
FIG. 4 is a cross-sectional view schematically illustrating the probe according to the first embodiment of the present invention.
Figure 5:
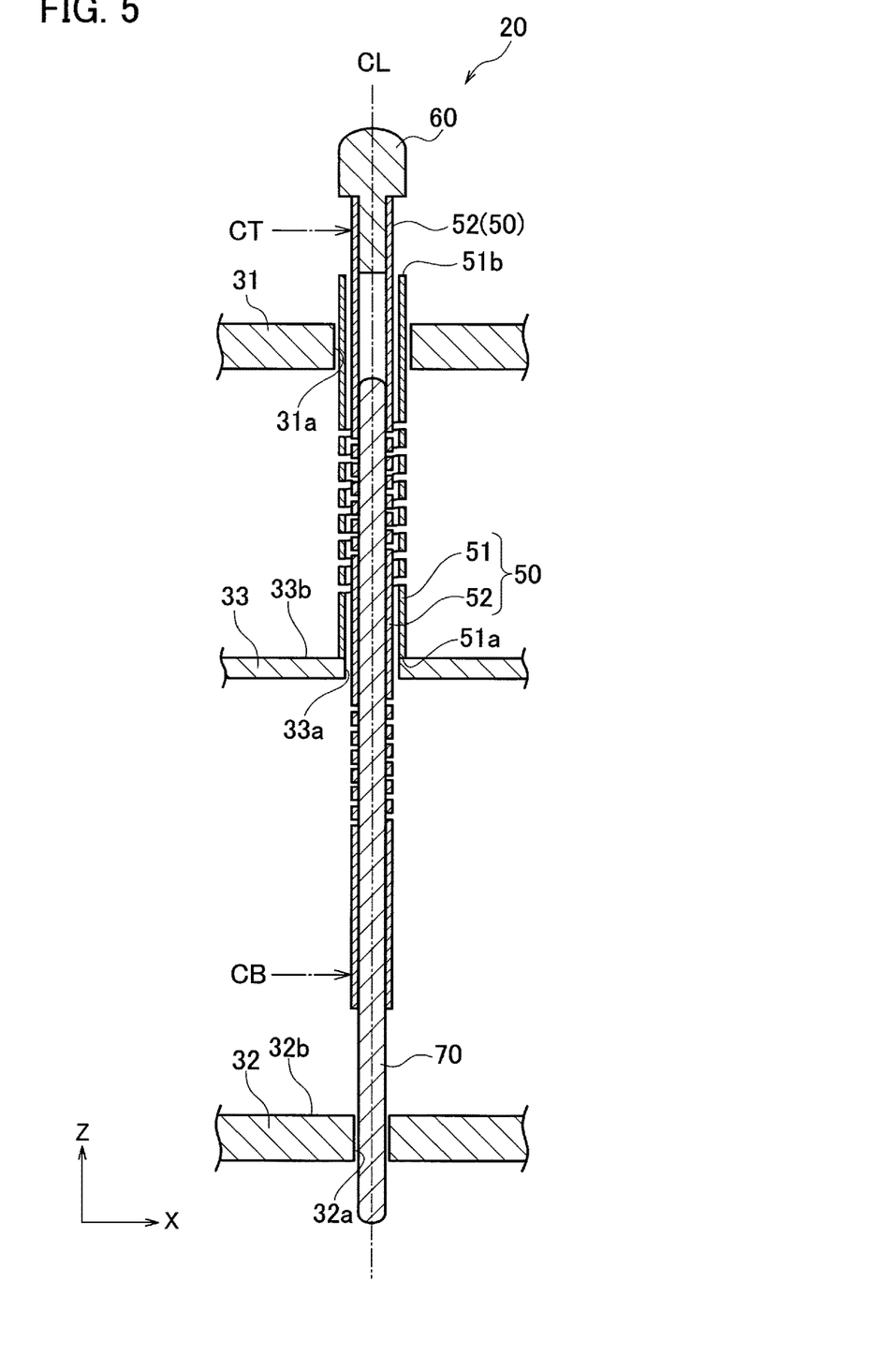
FIG. 5 is a cross-sectional view schematically illustrating the probe according to the first embodiment of the present invention.

As illustrated in FIGS. 3 to 4, the probe 20 includes a tubular barrel portion 50 extending in the up-down direction Z, a first plunger portion 60, and a second plunger portion 70. Meanwhile, the barrel portion 50, the first plunger portion 60, and the second plunger portion 70 are made of a conductive material.

The barrel portion 50 includes a tubular first barrel portion 51 and a tubular second barrel portion 52. The first barrel portion 51 is formed in a cylindrical shape having an inside diameter $\phi 1i$ and an outside diameter $\phi 1o$. The outside diameter $\phi 1o$ of the first barrel portion 51 is shorter than the diameter of the guide hole 31a of the upper guide plate 31 and is longer than the diameter of the guide hole 33a of the intermediate guide plate 33. Hence, a lower end portion 51a of the first barrel portion 51 abuts on an upper surface 33b of the intermediate guide plate 33 when the probe 20 is incorporated into the probe support body 18. Also, an upper end portion 51b of the first barrel portion 51 abuts on a lower surface 61a of a main body portion 61 of the below-mentioned first plunger portion 60.

The first barrel portion 51 includes a first spring portion 151 exerting a spring function in the up-down direction Z.

Specifically, the first spring portion 151 expands and contracts in the up-down direction Z and exerts an elastic force in the up-down direction Z.

For example, in the preload state, in which the base end portion 20b of the probe 20 is pressure-attached to the probe substrate 16, a compression force is applied to the first barrel portion 51 in the up-down direction Z. As a result, the first spring portion 151 is compressed along the up-down direction Z and applies an elastic force (pressing force) to the probe substrate 16.

Meanwhile, the first barrel portion 51 includes non-spring portions (not illustrated) that do not exert an elastic force at an upper side and a lower side of the first spring portion 151.

The second barrel portion 52 is arranged inside the first barrel portion 51. The second barrel portion 52 is formed in a cylindrical shape having a shorter outside diameter φ2o than the inside diameter φ1i of the first barrel portion 51. Since the second barrel portion 52 is arranged inside the first barrel portion 51 in this manner, the first barrel portion 51 and the second barrel portion 52 are arranged concentrically around a center axis CL. The outside diameter φ2o of the second barrel portion 52 is shorter than the diameter of the guide hole 33a of the intermediate guide plate 33 and is longer than the diameter of the guide hole 32a of the lower guide plate 32.

Also, the second barrel portion 52 includes a second spring portion 152 exerting a spring function in the up-down direction Z. Specifically, the second spring portion 152 expands and contracts in the up-down direction Z and exerts an elastic force in the up-down direction Z.

Also, in the present embodiment, as illustrated in FIG. 4, the second spring portion 152 includes an upper second spring portion 152x and a lower second spring portion 152y.

For example, in the overdrive state, in which the tip end portion 20a of the probe 20 is pressure-attached to the semiconductor wafer 14, when a compression force is applied to the second barrel portion 52 in the up-down direction Z, the second spring portion 152 is compressed along the up-down direction Z and applies an elastic force (pressing force) to the semiconductor wafer 14. In other words, both the upper second spring portion 152x and the lower second spring portion 152y are compressed along the up-down direction Z and apply an elastic force (pressing force).

Meanwhile, the second barrel portion 52 includes non-spring portions (not illustrated) that do not exert an elastic force at three portions including an upper side of the upper second spring portion 152x, a portion between the upper second spring portion 152x and the lower second spring portion 152y, and a lower side of the lower second spring portion 152y.

Also, as illustrated in FIG. 4, in the barrel portion 50, a length L1 of the first barrel portion 51 in the up-down direction Z and a length L2 of the second barrel portion 52 in the up-down direction Z differ. Specifically, the length L1 of the first barrel portion 51 in the up-down direction Z is shorter than the length L2 of the second barrel portion 52 in the up-down direction Z. A difference ΔL between the length L1 and the length L2 is shorter by a length α than a length LD between an upper surface 32b of the lower guide plate 32 and the upper surface 33b of the intermediate guide plate 33 in the up-down direction Z. Hence, a lower end portion 52a of the second barrel portion 52 is away upward in the up-down direction Z by the length α from the upper surface 32b of the lower guide plate 32.

The first plunger portion 60 is partially inserted into an upper end portion (a first end) of the barrel portion 50 and electrically contacts the probe substrate 16. Specifically, the first plunger portion 60 includes a wide main body portion 61 and a narrow insertion portion 62.

A width (a diameter φ61) of the main body portion 61 in the right-left direction X is longer than the inside diameter φ1i of the first barrel portion 51. A lower surface 61a of the main body portion 61 abuts on the upper end portion of the barrel portion 50. Specifically, the lower surface 61a of the main body portion 61 abuts on the upper end portion 51b of the first barrel portion 51 and an upper end portion 52b of the second barrel portion 52.

Here, the first plunger portion 60 abuts on the first barrel portion 51 at the main body portion 61 thereof and is not secured to the first barrel portion 51. Accordingly, as illustrated in FIG. 5, the first barrel portion 51 and the second barrel portion 52 can be separated from each other.

The insertion portion 62 is inserted into the second barrel portion 52 of the barrel portion 50. Also, the insertion portion 62 is secured at a predetermined position CT to the second barrel portion 52 of the barrel portion 50 by means of bonding. Examples of the bonding method are resistance welding (spot welding), laser welding, and swaging.

Also, a lower end portion 62a of the insertion portion 62 serves as a lower end portion 60a of the first plunger portion 60. The lower end portion 62a of the insertion portion 62 is located further upward in the up-down direction Z than an upper end portion 152xb of the upper second spring portion 152x.

The second plunger portion 70 is formed approximately in a columnar shape. The second plunger portion 70 is partially inserted into a lower end portion (a second end) of the barrel portion 50 and electrically contacts the semiconductor wafer 14.

The second plunger portion 70 is secured to the second barrel portion 52 at a predetermined position CB. Specifically, the second plunger portion 70 is secured to the second barrel portion 52 by means of bonding at the predetermined position CB located at the non-spring portion (not illustrated) arranged at the lower side of the lower second spring portion 152y. Meanwhile, a bonding method thereof is similar to the aforementioned bonding method for the insertion portion 62 of the first plunger portion 60.

Meanwhile, an upper end portion 70b of the second plunger portion 70 is located further upward in the up-down direction Z than a lower end portion of the second spring portion 152 included in the second barrel portion 52. Specifically, in the present embodiment, the upper end portion 70b of the second plunger portion 70 is located further upward in the up-down direction Z than the upper end portion 152xb of the upper second spring portion 152x of the second spring portion 152.

Effects

As described above, the probe 20 according to the first embodiment of the present invention includes the barrel portion 50, the first plunger portion 60, and the second plunger portion 70. The barrel portion 50 includes the first barrel portion 51 having the inside diameter φ1i (a predetermined inside diameter) and the second barrel portion 52 arranged inside the first barrel portion 51 (on a side of the center axis CL) and having the outside diameter φ2o, which is shorter than the inside diameter φ1i. That is, the first barrel portion 51 and the second barrel portion 52 are arranged concentrically. The first barrel portion 51 includes the first spring portion 151, and the second barrel portion 52 includes the second spring portion 152. Also, the first plunger portion 60 includes the main body portion 61 having a longer dimension (a width or a diameter) than the inside diameter φ1*i* of the first barrel portion 51.

Consequently, since the first plunger portion 60 (or the second plunger portion 70) can exert a spring function, for example, in a state in which the first spring portion 151 and the second spring portion 152 are arranged in parallel in the up-down direction Z, the lengths of the first spring portion 151 and the second spring portion 152 in the up-down direction Z can be shorter than in a case in which the first spring portion 151 and the second spring portion 152 are arranged in series in the up-down direction Z. Since this enables the length of the probe 20 in the up-down direction Z to be shortened, the probe 20 is difficult to flex, and contact between the probes 20 caused by flexure of the probes 20 can be prevented.

Further, since contact between the probes 20 caused by flexure of the probes 20 can be prevented, the probes 20 can be arranged in the probe support body 18 at narrow pitches.

Also, in the probe 20 according to the first embodiment, although the lower end portion 52*a* of the second barrel portion 52 is away upward in the up-down direction Z by the length α from the upper surface 32*b* of the lower guide plate 32 (refer to FIG. 4), the length α may arbitrarily be changed.

For example, the length α may be zero. That is, the length α may be dispensed with. In this case, when the probe 20 is incorporated into the probe support body 18, the lower end portion 51*a* of the first barrel portion 51 abuts on the upper surface 33*b* of the intermediate guide plate 33, and the lower end portion 52*a* of the second barrel portion 52 abuts on the upper surface 32*b* of the lower guide plate 32. In the preload state, the first spring portion 151 and the second spring portion 152 press the first plunger portion 60 toward the probe substrate 16. As a result, since the first plunger portion 60 can be pressed to the probe substrate 16 by the elastic force (pressing force) of both the first spring portion 151 and the second spring portion 152, the first plunger portion 60 can be pressed more strongly. Also, even in a case in which either the first spring portion 151 or the second spring portion 152 deteriorates (for example, deterioration due to generation of sagging), the other one can perform pressing, and an electric connecting relationship between the first plunger portion 60 and the probe substrate 16 can thus be maintained for a longer period.

Further, the length α may be set to be equal to or longer than a compression length β by which the first spring portion 151 of the first barrel portion 51 compresses in the preload state. In this case, even in the preload state, the lower end portion 52*a* of the second barrel portion 52 does not abut on the upper surface 32*b* of the lower guide plate 32 but is away from the upper surface 32*b*. Accordingly, the spring functions can be separated depending on whether the probe 20 is in the preload state or in the overdrive state. Specifically, in the preload state, only the first spring portion 151 of the first barrel portion 51 presses the first plunger portion 60 toward the probe substrate 16. On the other hand, in the overdrive stage, only the second spring portion 152 of the second barrel portion 52 presses the second plunger portion 70 toward the semiconductor wafer 14. Accordingly, the pressing force in the preload state and the pressing force in the overdrive state can be adjusted more flexibly by adjusting a spring constant of the first spring portion 151 of the first barrel portion 51 and a spring constant of the second spring portion 152 of the second barrel portion 52.

Still further, the length α may be set so that the ratio of the length α to the compression length β by which the first spring portion 151 of the first barrel portion 51 compresses in the preload state may be a predetermined ratio (for example, (β/2). In this case, in the middle of pressure attachment of the base end portion 20*b* of the probe 20 to the probe substrate 16 to bring the preload state, the lower end portion 52*a* of the second barrel portion 52 abuts on the upper surface 32*b* of the lower guide plate 32. Accordingly, only the first spring portion 151 of the first barrel portion 51 presses the first plunger portion 60 toward the probe substrate 16 in a case in which the compression length of the first spring portion 151 is in a range less than the predetermined ratio (for example, less than (β/2), and the first spring portion 151 and the second spring portion 152 press the first plunger portion 60 toward the probe substrate 16 in a case in which the compression length of the first spring portion 151 is in a range equal to or more than the predetermined ratio (for example, equal to or more than (β/2). Accordingly, the pressing force (elastic force) can be increased gradually in accordance with the compression length.

In the probe 20 according to the first embodiment of the present invention, the length L1 of the first barrel portion 51 in the up-down direction Z is shorter than the length L2 of the second barrel portion 52 in the up-down direction Z. Accordingly, since material cost for the first barrel portion 51 can be reduced, manufacturing cost for the probe 20 can be reduced.

Also, in the probe 20 according to the first embodiment, the first barrel portion 51 and the second barrel portion 52 can be separated from each other. Accordingly, the first barrel portion 51 and the second barrel portion 52 can be replaced separately. For example, in a case in which either the first barrel portion 51 or the second barrel portion 52 fails, only the failed one can be replaced, which is excellent in convenience.

Also, in the probe 20 according to the first embodiment, the second spring portion 152 includes the upper second spring portion 152*x* and the lower second spring portion 152*y*. Consequently, the spring constants of the upper second spring portion 152*x* and the lower second spring portion 152*y* can differ, for example. Accordingly, in accordance with the combination between the upper second spring portion 152*x* and the lower second spring portion 152*y*, the pressing force to the semiconductor wafer 14 in the overdrive state can be adjusted more flexibly.

In the probe 20 according to the first embodiment, the upper end portion 70*b* of the second plunger portion 70 to be inserted into the barrel portion 50 is located further upward in the up-down direction Z than a lower end portion 152*ya* of the lower second spring portion 152*y* of the second spring portion 152 included in the second barrel portion 52. Specifically, the upper end portion 70*b* of the second plunger portion 70 is located further upward in the up-down direction Z than the upper end portion 152*xb* of the upper second spring portion 152*x* (the upper end portion of the second spring portion 152). Accordingly, since the second plunger portion 70 is arranged inside the second spring portion 152, the probe 20 is difficult to be bent at the second spring portion 152 thereof.

First Modification Example

Figure 6:
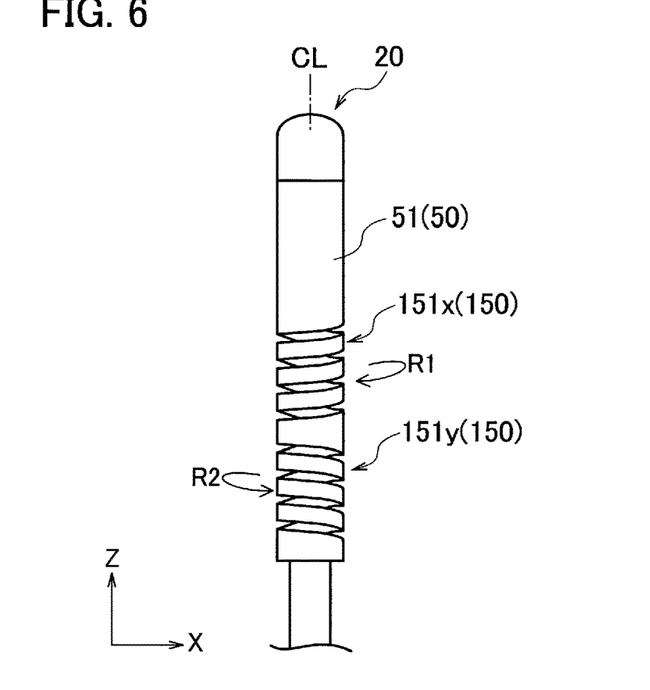
FIG. 6 is a side view schematically illustrating the probe according to a modification example of the first embodiment of the present invention.

Next, a first modification example of the probe 20 according to the first embodiment of the present invention will be described. FIG. 6 is a side view illustrating the probe 20 according to the present modification example.

As illustrated in FIG. 6, in the probe 20 according to the present modification example, the first spring portion 151 included in the first barrel portion 51 includes an upper first spring portion 151x and a lower first spring portion 151y arranged further downward in the up-down direction Z than the upper first spring portion 151x.

Meanwhile, the first barrel portion 51 includes non-spring portions (not illustrated) that do not exert an elastic force at three portions including an upper side of the upper first spring portion 151x, a portion between the upper first spring portion 151x and the lower first spring portion 151y, and a lower side of the lower first spring portion 151y.

Also, the upper first spring portion 151x and the lower first spring portion 151y are formed in spiral shapes in opposite winding directions from each other. Specifically, as illustrated in FIG. 6, the upper first spring portion 151x is formed in a spiral shape winding to slant downward to left, and the lower first spring portion 151y is formed in a spiral shape winding to slant downward to right.

As described above, in the probe 20 according to the present modification example, the first spring portion 151 includes the upper first spring portion 151x and the lower first spring portion 151y. Consequently, the spring constants of the upper first spring portion 151x and the lower first spring portion 151y can differ, for example. Accordingly, in accordance with the combination between the upper first spring portion 151x and the lower first spring portion 151y, the pressing force to the probe substrate 16 in the preload state can be adjusted more flexibly.

Also, in the probe 20 according to the present modification example, the upper first spring portion 151x and the lower first spring portion 151y are formed in spiral shapes in opposite winding directions from each other. Accordingly, the biasing forces in the winding directions generated by compression of the upper first spring portion 151x and the lower first spring portion 151y are canceled out, and the probe 20 is more difficult to be bent and twisted than in a case in which two spiral spring portions having the same winding directions are connected.

Second Modification Example

Figure 7:
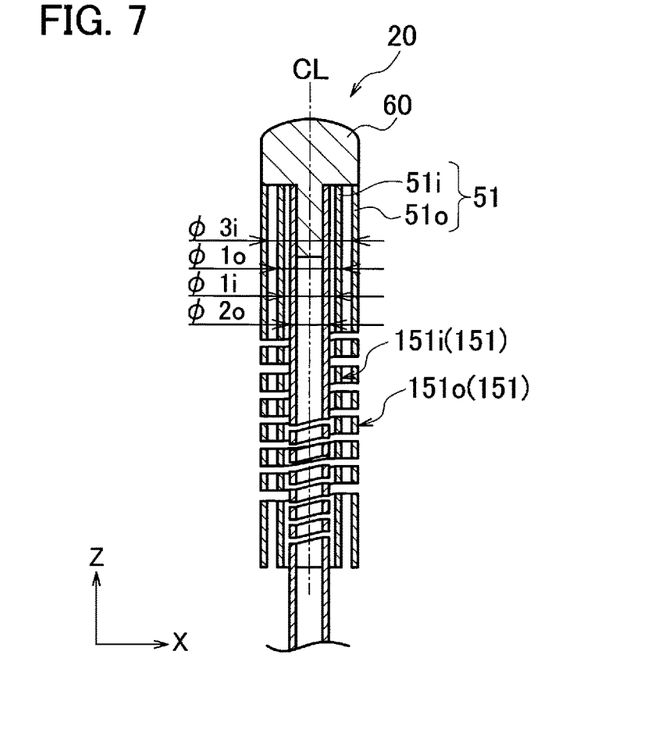
FIG. 7 is a cross-sectional view schematically illustrating the probe according to a modification example of the first embodiment of the present invention.

Next, a second modification example of the probe 20 according to the first embodiment of the present invention will be described. FIG. 7 is a cross-sectional view illustrating the probe 20 according to the present modification example.

As illustrated in FIG. 7, in the probe 20 according to the present modification example, the first barrel portion 51 includes a plurality of barrel portions having different diameters. Specifically, the first barrel portion 51 includes an outside first barrel portion 51o and an inside first barrel portion 51i arranged inside the outside first barrel portion 51o. The outside first barrel portion 51o has an inside diameter φ3i (separate inside diameter), and the inside first barrel portion 51i has an outside diameter φ1o, which is shorter than the inside diameter φ3i.

Also, the outside first barrel portion 51o includes an outside first spring portion 151o exerting a spring function in the up-down direction Z, and the inside first barrel portion 51i includes an inside first spring portion 151i exerting a spring function in the up-down direction Z.

As described above, in the probe 20 according to the second modification example, the first barrel portion 51 includes the outside first barrel portion 51o and the inside first barrel portion 51i, the outside first barrel portion 51o includes the outside first spring portion 151o, and the inside first barrel portion 51i includes the inside first spring portion 151i. Consequently, the spring constants of the outside first spring portion 151o and the inside first spring portion 151i can differ, for example. Accordingly, in accordance with the combination between the outside first spring portion 151o and the inside first spring portion 151i, the pressing force to the probe substrate 16 in the preload state can be adjusted more flexibly.

Other Embodiments of Present Invention

Although the present invention has been described in detail with reference to the above embodiments, it is to be understood by those skilled in the art that the present invention is not limited to the embodiments described herein.

For example, in the above embodiments, although a case in which the first plunger portion 60 is not secured to the first barrel portion 51 has been described as an example, the first plunger portion 60 may be secured to the first barrel portion 51. That is, the first barrel portion 51 and the second barrel portion 52 may be connected via the first plunger portion 60.

Also, for example, the probe support body 18 has only to include at least one probe 20 described in the above embodiments.

Also, in the above embodiments, although the upper end portion 70b of the second plunger portion 70 is located further upward than the upper end portion 152xb of the upper second spring portion 152x, the present invention is not limited to this. For example, the upper end portion 70b of the second plunger portion 70 may be arranged between an upper end portion 152yb of the lower second spring portion 152y and a lower end portion 152xa of the upper second spring portion 152x. In this case, the lower end portion 60a of the first plunger portion 60, that is, the lower end portion 62a of the insertion portion 62 of the first plunger portion 60, is arranged between the lower end portion 152xa of the upper second spring portion 152x and the upper end portion 152yb of the lower second spring portion 152y. Thus, since the first plunger portion 60 is arranged inside the upper second spring portion 152x, and the second plunger portion 70 is arranged inside the lower second spring portion 152y, the probe 20 is difficult to be bent at the second spring portion 152 thereof.

Also, in the above first modification example, although the shapes of the upper first spring portion 151x and the lower first spring portion 151y are focused, and a case in which the upper first spring portion 151x and the lower first spring portion 151y are formed in spiral shapes in opposite winding directions from each other has been described as an example, the present invention is not limited to this. For example, in the second barrel portion 52, the upper second spring portion 152x and the lower second spring portion 152y may be formed in spiral shapes in opposite winding directions from each other.

In this manner, the present invention is not limited to the above embodiments as they are but can be embodied in a practical phase by modifying the components without departing from the scope of the present invention. Also, various inventions can be formed by an appropriate combination of the plurality of components disclosed in the above embodiments. For example, several components may be deleted from all of the components described in the embodiments.

REFERENCE SIGNS LIST 1 testing apparatus
2 card-like connecting apparatus
12 chuck 14 semiconductor wafer
14a electrode pad
10 probe substrate
18 probe support body
20 probe
20a tip end portion
20b base end portion
31 upper guide plate
32 lower guide plate
33 intermediate guide plate
50 barrel portion
51 first barrel portion
52 second barrel portion
60 first plunger portion
70 second plunger portion
151 first spring portion
152 second spring portion

The invention claimed is:

1. A probe electrically connecting a first contact target to a second contact target, comprising:
a barrel portion extending in an up-down direction and formed in a tubular shape;
a first plunger portion partially inserted into a first end of the barrel portion and electrically contacting the first contact target; and
a second plunger portion partially inserted into a second end of the barrel portion and electrically contacting the second contact target,
wherein the barrel portion includes
a first barrel portion having a predetermined inside diameter, and
a second barrel portion arranged inside the first barrel portion and having a shorter outside diameter than the predetermined inside diameter,
wherein the first barrel portion includes a first spring portion exerting a spring function in the up-down direction,
wherein the second barrel portion includes a second spring portion exerting a spring function in the up-down direction,
wherein the first plunger portion includes a main body portion having a longer dimension than an inside diameter of the first barrel portion,
wherein the first spring portion includes an upper first spring portion and a lower first spring portion arranged further downward in the up-down direction than the upper first spring portion, and
wherein the upper first spring portion and the lower first spring portion are formed in spiral shapes in opposite winding directions from each other.

2. The probe according to claim 1, wherein the first spring portion and the second spring portion press the first plunger portion toward the first contact target.

3. The probe according to claim 1, wherein a length of the first barrel portion in the up-down direction is shorter than a length of the second barrel portion in the up-down direction.

4. The probe according to claim 1, wherein the first barrel portion and the second barrel portion can be separated from each other.

5. The probe according to claim 1, wherein an upper end portion of the second plunger portion to be inserted into the barrel portion is located further upward in the up-down direction than a lower end portion of the second spring portion included in the second barrel portion.

6. A probe electrically connecting a first contact target to a second contact target, comprising:
a barrel portion extending in an up-down direction and formed in a tubular shape;
a first plunger portion partially inserted into a first end of the barrel portion and electrically contacting the first contact target; and
a second plunger portion partially inserted into a second end of the barrel portion and electrically contacting the second contact target,
wherein the barrel portion includes:
a first barrel portion having a predetermined inside diameter, and
a second barrel portion arranged inside the first barrel portion and having a shorter outside diameter than the predetermined inside diameter,
wherein the first barrel portion includes a first spring portion exerting a spring function in the up-down direction,
wherein the second barrel portion includes a second spring portion exerting a spring function in the up-down direction,
wherein the first plunger portion includes a main body portion having a longer dimension than an inside diameter of the first barrel portion,
wherein the first barrel portion includes:
an outside first barrel portion having a separate inside diameter, and
an inside first barrel portion arranged inside the outside first barrel portion and having an outside diameter which is shorter than the separate inside diameter,
wherein the outside first barrel portion includes an outside first spring portion exerting a spring function in the up-down direction, and
wherein the inside first barrel portion includes an inside first spring portion exerting a spring function in the up-down direction.

7. The probe according to claim 6, wherein the first spring portion and the second spring portion press the first plunger portion toward the first contact target.

8. The probe according to claim 6, wherein a length of the first barrel portion in the up-down direction is shorter than a length of the second barrel portion in the up-down direction.

9. The probe according to claim 6, wherein the first spring portion includes an upper first spring portion and a lower first spring portion arranged further downward in the up-down direction than the upper first spring portion.

10. The probe according to claim 6, wherein the first barrel portion and the second barrel portion can be separated from each other.

11. The probe according to claim 6, wherein an upper end portion of the second plunger portion to be inserted into the barrel portion is located further upward in the up-down direction than a lower end portion of the second spring portion included in the second barrel portion.

12. An electric connecting apparatus comprising:
a plurality of probes electrically connecting a first contact target to a second contact target,
wherein each of the plurality of probes includes
a barrel portion extending in an up-down direction and formed in a tubular shape;
a first plunger portion partially inserted into a first end of the barrel portion and electrically contacting the first contact target; and
a second plunger portion partially inserted into a second end of the barrel portion and electrically contacting the second contact target,
wherein the barrel portion includes a first barrel portion having a predetermined inside diameter, and a second barrel portion arranged inside the first barrel portion and having a shorter outside diameter than the predetermined inside diameter, wherein the first barrel portion includes a first spring portion exerting a spring function in the up-down direction, wherein the second barrel portion includes a second spring portion exerting a spring function in the up-down direction, wherein the first plunger portion includes a main body portion having a longer dimension than an inside diameter of the first barrel portion, wherein the first spring portion includes an upper first spring portion and a lower first spring portion arranged further downward in the up-down direction than the upper first spring portion, and wherein the upper first spring portion and the lower first spring portion are formed in spiral shapes in opposite winding directions from each other.

13. An electric connecting apparatus comprising:
a plurality of probes electrically connecting a first contact target to a second contact target,
wherein each of the plurality of probes includes:
  a barrel portion extending in an up-down direction and formed in a tubular shape;
  a first plunger portion partially inserted into a first end of the barrel portion and electrically contacting the first contact target; and
  a second plunger portion partially inserted into a second end of the barrel portion and electrically contacting the second contact target,
wherein the barrel portion includes:
  a first barrel portion having a predetermined inside diameter, and
  a second barrel portion arranged inside the first barrel portion and having a shorter outside diameter than the predetermined inside diameter,
wherein the first barrel portion includes a first spring portion exerting a spring function in the up-down direction,
wherein the second barrel portion includes a second spring portion exerting a spring function in the up-down direction, and
wherein the first plunger portion includes a main body portion having a longer dimension than an inside diameter of the first barrel portion,
wherein the first barrel portion includes:
  an outside first barrel portion having a separate inside diameter, and
  an inside first barrel portion arranged inside the outside first barrel portion and having an outside diameter which is shorter than the separate inside diameter,
wherein the outside first barrel portion includes an outside first spring portion exerting a spring function in the up-down direction, and
wherein the inside first barrel portion includes an inside first spring portion exerting a spring function in the up-down direction.

* * * * *